(12) United States Patent
Hoang et al.

(10) Patent No.: US 9,000,288 B2
(45) Date of Patent: Apr. 7, 2015

(54) CURRENT COLLECTOR BAR AND GRID PATTERN FOR A PHOTOVOLTAIC SOLAR CELL

(75) Inventors: Bao Hoang, San Francisco, CA (US); Samuel Geto Beyene, Hayward, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 201 days.

(21) Appl. No.: 13/189,354

(22) Filed: Jul. 22, 2011

(65) Prior Publication Data

US 2013/0019919 A1 Jan. 24, 2013

(51) Int. Cl.
*H02N 6/00* (2006.01)
*H01L 31/042* (2014.01)
*H01L 31/0224* (2006.01)
*H01L 31/05* (2014.01)

(52) U.S. Cl.
CPC ......... *H01L 31/022433* (2013.01); *Y02E 10/50* (2013.01); *H01L 31/0504* (2013.01)

(58) Field of Classification Search
CPC .............. H01L 31/022433; H01L 31/0504
USPC ........................................ 136/244, 252, 256
See application file for complete search history.

(56) References Cited

U.S. PATENT DOCUMENTS

| | | | |
|---|---|---|---|
| 3,369,939 A * | 2/1968 | Myer | 136/246 |
| 3,696,286 A | 10/1972 | Ule | |
| 4,401,839 A | 8/1983 | Pyle | |
| 4,413,157 A | 11/1983 | Ames | |
| 4,542,578 A | 9/1985 | Yamano et al. | |

(Continued)

FOREIGN PATENT DOCUMENTS

GB 2224391 5/1990

OTHER PUBLICATIONS

Diamond—Definition and More from the Free Merriam-Webster Dictionary, www.merriam-webster.com/dictionary/diamond, accessed on Nov. 4, 2013.*

(Continued)

*Primary Examiner* — Jonathan Johnson
*Assistant Examiner* — Angelo Trivisonno
(74) *Attorney, Agent, or Firm* — Weaver Austin Villeneuve & Sampson LLP

(57) ABSTRACT

A solar panel has a number of rectilinear photovoltaic solar cells. Each solar cell has four edges, a current collector bar having at least two conductively coupled collector bar segments, and a grid of electrodes conductively coupled to the collector bar. A first collector bar segment is substantially parallel to and proximate to a first edge of the solar cell, a second collector bar segment is substantially parallel to and proximate to a second edge of the solar cell, the second edge being orthogonal with respect to the first edge. In some disclosed techniques, the solar panel has a string of solar cells disposed on a surface of the solar panel in a substantially spiral or serpentine manner and no solar cell within the string is electrically connected to another solar cell in the string by any means other than a cell interconnect.

6 Claims, 7 Drawing Sheets

(56) References Cited

U.S. PATENT DOCUMENTS

| | | | |
|---|---|---|---|
| 4,609,770 | A | 9/1986 | Nishiura et al. |
| 4,652,693 | A | 3/1987 | Bar-On |
| 4,705,911 | A | 11/1987 | Nakano et al. |
| 4,754,544 | A | 7/1988 | Hanak |
| 5,006,179 | A | 4/1991 | Gaddy |
| 5,236,516 | A | 8/1993 | Noguchi et al. |
| 5,389,159 | A | 2/1995 | Kataoka et al. |
| 5,542,988 | A | 8/1996 | Bogus |
| 5,637,155 | A | 6/1997 | Inoue |
| 5,637,156 | A | 6/1997 | Kubota et al. |
| 5,688,337 | A | 11/1997 | Mosher |
| 5,897,715 | A | 4/1999 | Ward et al. |
| 6,034,322 | A * | 3/2000 | Pollard ........................ 136/256 |
| 6,248,950 | B1 * | 6/2001 | Hoeber et al. ................. 136/251 |
| 6,294,725 | B1 * | 9/2001 | Hirschberg et al. ........... 136/256 |
| 2006/0118165 | A1 * | 6/2006 | Van Roosmalen et al. ... 136/263 |
| 2009/0126788 | A1 | 5/2009 | Hishida et al. |

OTHER PUBLICATIONS

PCT International Search Report dated Sep. 28, 2012 issued in PCT/US2012/046924.

La Roche, G. J., et al. (Sep. 1995) "Long Term Thermal Cycling Tests on Gold Interconnected Solar Cells", European Space Power, vol. 2: Photovoltaic Generators, Energy Storage, Proceedings of the $4^{th}$ European Space Power Conference, Poitiers, France, Sep. 4-8, 1995, Edited by T.-D. Guyenne. Paris: European Space Agency (ESA), ESA-SP, vol. 369, 1995, pp. 495-500.

Patent Abstracts of Japan, Publication No. 61289675 (Dec. 19, 1986) entitled "High Voltage Solar Battery Array", 1 page.

Sankaran, M., et al. (Sep. 1995) "On the Development of Solar Arrays for INSAT 2A and 2B", Proceedings of the European Space Power Conference, vol. 2, pp. 649-652.

* cited by examiner

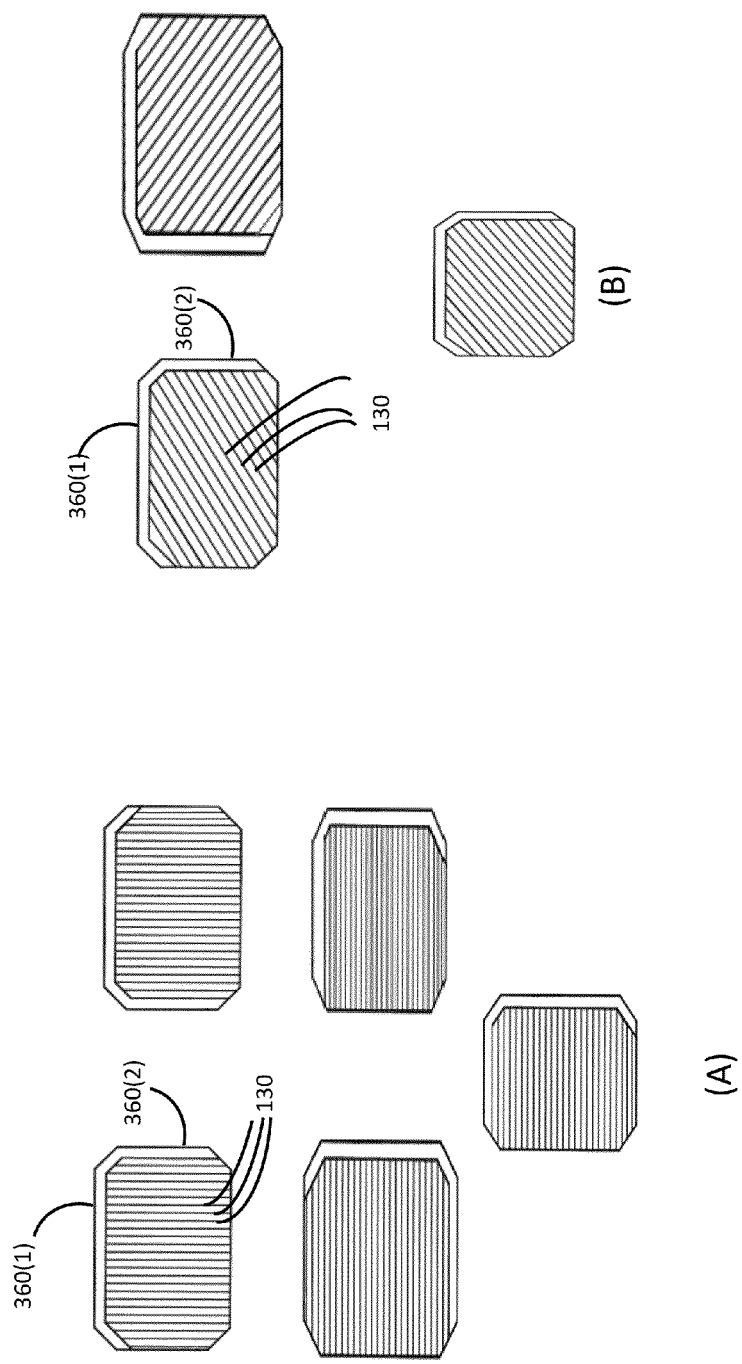

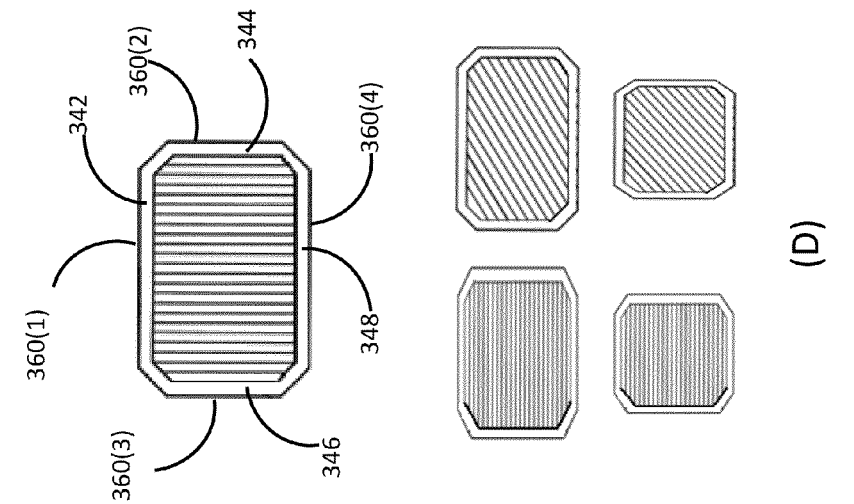
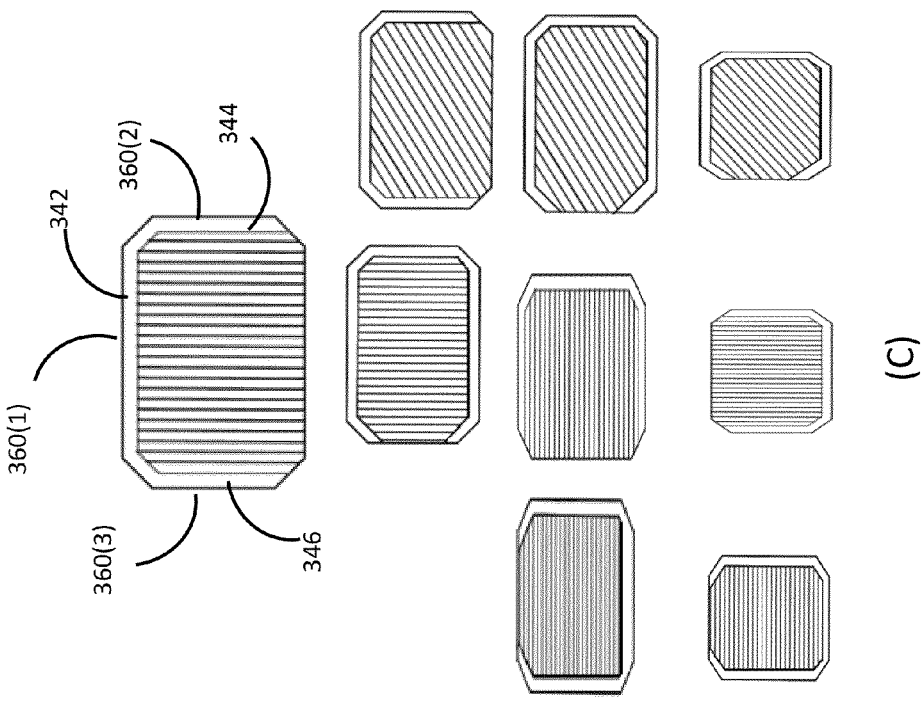
FIG. 5 (cont'd)

CURRENT COLLECTOR BAR AND GRID PATTERN FOR A PHOTOVOLTAIC SOLAR CELL

TECHNICAL FIELD

This invention relates generally to photovoltaic solar array panels, and, more particularly, to improved configurations of a solar cell current collector bar and contact grid pattern.

BACKGROUND OF THE INVENTION

The assignee of the present invention designs and manufactures spacecraft for communications and broadcast services. Electrical power for such spacecraft is conventionally generated by photovoltaic solar arrays, typically having several thousands of solar cells.

Solar cells of numerous varieties are known, but typical features of the types of cells with which the present inventors are concerned, are illustrated in FIG. 1. Referring to cross-sectional schematic view FIG. 1A, and top view FIG. 1B, solar cell 100 has a semiconductor substrate 110 having a base region or layer 112 formed of a first conductivity type below an emitter region or layer 114 of opposite conductivity type. A metallized conductor on the back surface of the base region forms electrode 120. A grid on the front surface of the emitter region, which surface is the light receiving surface, forms a second electrode. The grid, typically composed of fine metallic lines 130, is conductively coupled to at least one current collector bar 140, and may be covered by a cover glass (not shown). For improved packing densities, cells having a substantially rectilinear (square or rectangular) footprint are preferable. Referring to FIG. 1C, a substantially rectilinear cell may have one or more relatively short corner edge segments 150 disposed at an obtuse angle to the main side edges 160.

Referring now to FIG. 2A, in order to connect an electrical series (or "string" 201) of solar cells, one or more cell interconnects 270 may be disposed between adjacent cells that conductively couple back surface electrode 120 of one cell to current collector bar 140 of the next cell in string 201.

Solar arrays that may advantageously employ the present invention are described, for example, in Hoeber, et al., U.S. Pat. No. 6,248,950, (hereinafter, "Hoeber"), and assigned to the present assignee, the content of which is hereby incorporated into the present application in its entirety. As disclosed in Hoeber, a known solar array scheme provides for a number of strings to be connected in parallel. As Hoeber also discloses, it has been found advantageous to arrange each individual string in a spiral arrangement, because doing so reduces the maximum voltage difference between any two adjacent cells. An example of a spiral arrangement of solar cells of the aforementioned type is illustrated in FIG. 2B. In the illustrated example, a string 200 of solar cells 100 extends from and between (positive) busbar terminal 280 at cell 100(8) and (return) busbar terminal 280 at cell 100(1). Vertically aligned, adjacent, cells are electrically connected by interconnects 270. Other cells, for example, cell 100(2) and cell 100(3), cell 100(4) and cell 100(5), and cell 100(6) and cell 100(7), are connected by electrical wiring 290, attached to respective busbar terminals 280.

As the demand for higher power spacecraft has grown, so has the demand for higher power solar arrays, each array typically consisting of two or more solar panels, with a consequent requirement to arrange even higher numbers of solar cells on each solar panel. This in turn places an increased emphasis on improving the ratio of solar cell area to solar panel area (hereinafter, "the panel packing ratio") and in achieving increased reliability and cost efficiencies in making the necessary electrical connections between cells.

In light of the foregoing, solar cell configurations, whether for space or for ground applications, that permit improvements in the above mentioned metrics, are desirable.

SUMMARY

The present inventors have appreciated that an improved configuration of a solar cell current collector bar and contact grid pattern, as described hereinbelow, will yield increased solar panel efficiencies by improving the panel packing ratio. Moreover, substantial elimination of a need for external bus bars and/or wire interconnections between solar cells simplifies solar panel integration, which in turn contributes to an improvement in panel reliability and decrease in panel cost.

According to an embodiment, a solar panel has a number of rectilinear photovoltaic solar cells, each solar cell having a current collector bar and a grid of electrodes conductively coupled thereto, the current collector bar comprising at least two conductively coupled collector bar segments. Each cell has a first edge, a second edge, a third edge, and a fourth edge. A first collector bar segment is substantially parallel to and proximate to the first edge, and a second collector bar segment is substantially parallel to and proximate to the second edge, the second edge being orthogonal with respect to the first edge. No collector bar segment is parallel to and proximate to at least one of the third edge and the fourth edge.

In an embodiment, the solar panel may include a number of strings, and each string may include a series connected subset of the solar cells. In an embodiment, at least one of the strings may be disposed on a surface of the solar panel in a serpentine pattern or in a substantially spiral pattern. The string may include a number of cell interconnects, and each solar cell within the string may be electrically connected to at least one adjacent solar cell in the string by way of at least one of the cell interconnects. No solar cell within the string is electrically connected to another solar cell in the string by any means other than at least one of the cell interconnects.

In an embodiment, the grid of electrodes may include a number of parallel, substantially straight, metallic lines. In a further embodiment, each of the parallel metallic lines may be disposed substantially orthogonal to the first edge and substantially parallel to the second edge. In an alternative embodiment, each of the parallel metallic lines may be disposed at an acute angle to the first edge and to the second edge.

In yet another embodiment, a photovoltaic solar cell includes a current collector bar, a grid of metallic lines conductively coupled thereto, a first edge, a second edge, a third edge, and a fourth edge. The current collector bar includes at least two conductively coupled collector bar segments, where a first collector bar segment is substantially parallel to and proximate to the first edge, and a second collector bar segment is substantially parallel to and proximate to the second edge, the second edge being orthogonal with respect to the first edge, and no collector bar segment is parallel to and proximate to at least one of the third edge and the fourth edge.

In an embodiment, the photovoltaic solar cell may be substantially square. The substantially square solar cell may have at least one corner section disposed between two edges, the corner section being substantially shorter than a length of any edge.

In another embodiment, the photovoltaic solar cell may be substantially rectangular. The first edge length may be at least 1.1 times as long as the second edge length. The substantially rectangular solar cell may have at least one corner section disposed between two edges, the corner section being substantially shorter than a length of any edge.

In a yet further embodiment, a third collector bar segment may be substantially parallel to the third edge, the third edge being orthogonal to one of the first edge and the second edge.

In an embodiment, a solar panel includes a plurality of rectilinear photovoltaic solar cells, and a plurality of strings, each string including a series connected subset of the plurality of solar cells. At least a first string of the plurality of strings is disposed on a surface of the solar panel in a serpentine or in a substantially spiral pattern, the first string including a plurality of cell interconnects, and each solar cell within the first string being electrically connected to at least one adjacent solar cell in the first string by way of at least one of the cell interconnects; and no solar cell of the first string is electrically connected to another solar cell of the first string by any means other than by at least one of said cell interconnects. Each solar cell may include a current collector bar, a grid of metallic lines conductively coupled thereto, a first edge, a second edge, a third edge, and a fourth edge, the current collector bar including at least two conductively coupled collector bar segments. A first collector bar segment may be substantially parallel to and proximate to the first edge, and a second collector bar segment may be substantially parallel to and proximate to the second edge, the second edge being orthogonal with respect to the first edge. In an embodiment, no collector bar segment is parallel to and proximate to at least one of the third edge and the fourth edge. In another embodiment, the current collector bar includes at least three conductively coupled collector bar segments, and a third collector bar segment is substantially parallel to and proximate to the third edge, said third edge being orthogonal to one of the first edge and the second edge. In a still further embodiment, the current collector bar comprises at least four conductively coupled collector bar segments, and a fourth collector bar segment is substantially parallel to and proximate to the fourth edge, said fourth edge being orthogonal to one of the first edge and the second edge.

BRIEF DESCRIPTION OF THE DRAWINGS

Features of the invention are more fully disclosed in the following detailed description of the preferred embodiments, reference being had to the accompanying drawings, in which:

FIG. 5 illustrates examples of solar cells, according to various embodiments.

Figure 1:
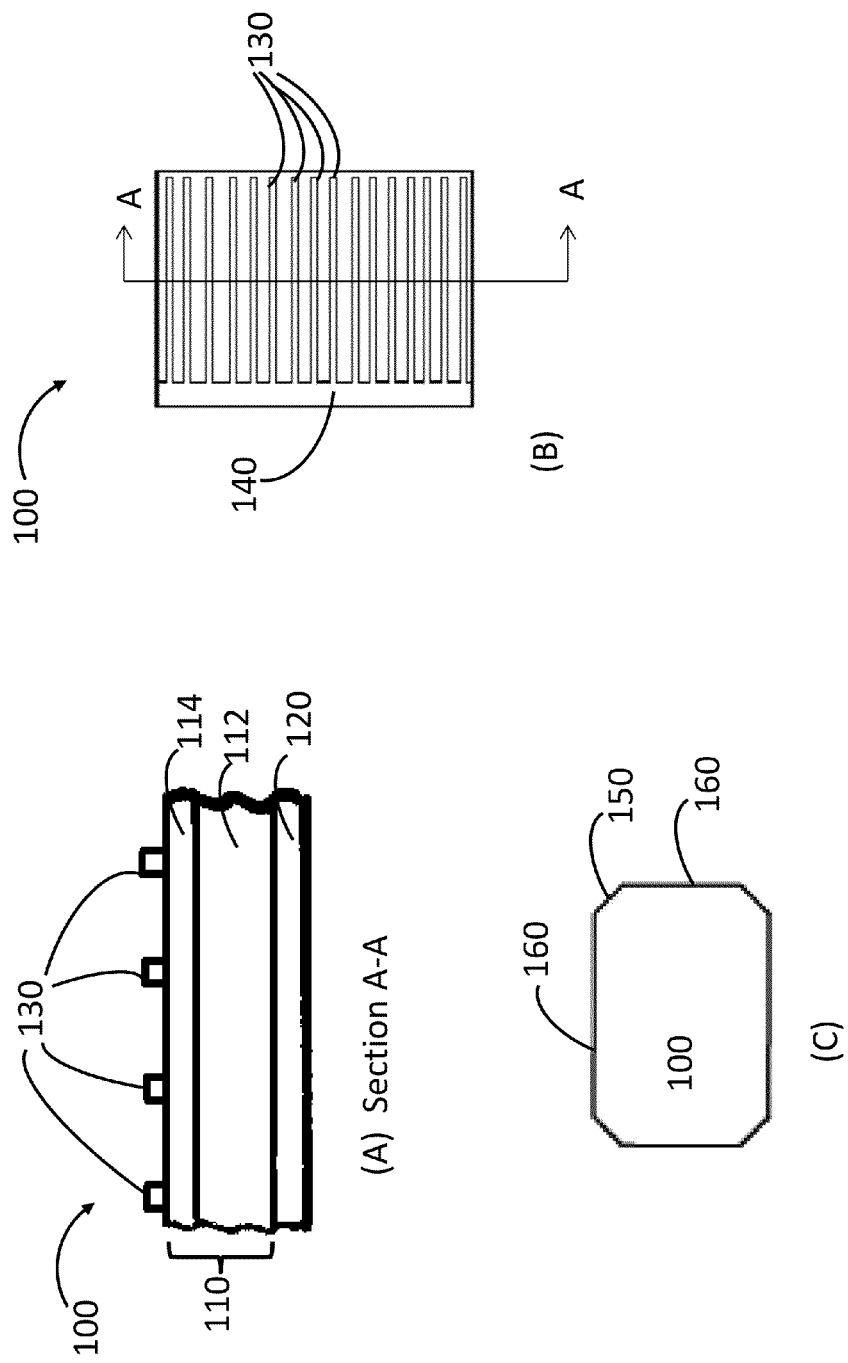
FIG. 1 illustrates examples of solar cells of the prior art.
Figure 2:
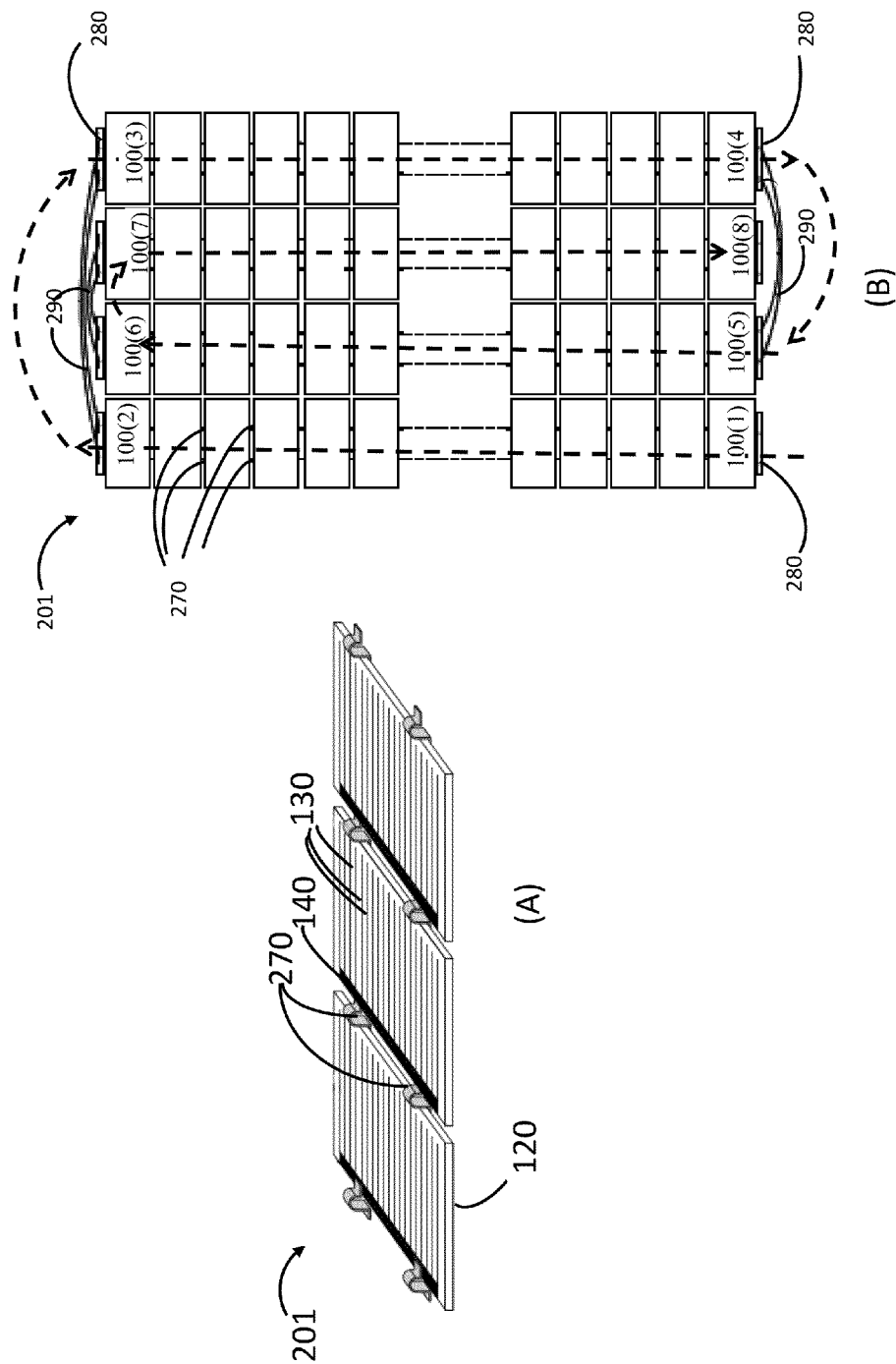
FIG. 2 illustrates examples of a string of solar cells of the prior art.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the subject invention as defined by the appended claims.

DETAILED DESCRIPTION

Specific examples of embodiments will now be described with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element, or intervening elements may be present. It will be understood that although the terms "first" and "second" are used herein to describe various elements, these elements should not be limited by these terms. These terms are used only to distinguish one element from another element. As used herein, the term "and/or" includes any and all combinations of one or more of the associated listed items. The symbol "/" is also used as a shorthand notation for "and/or".

Figure 3:
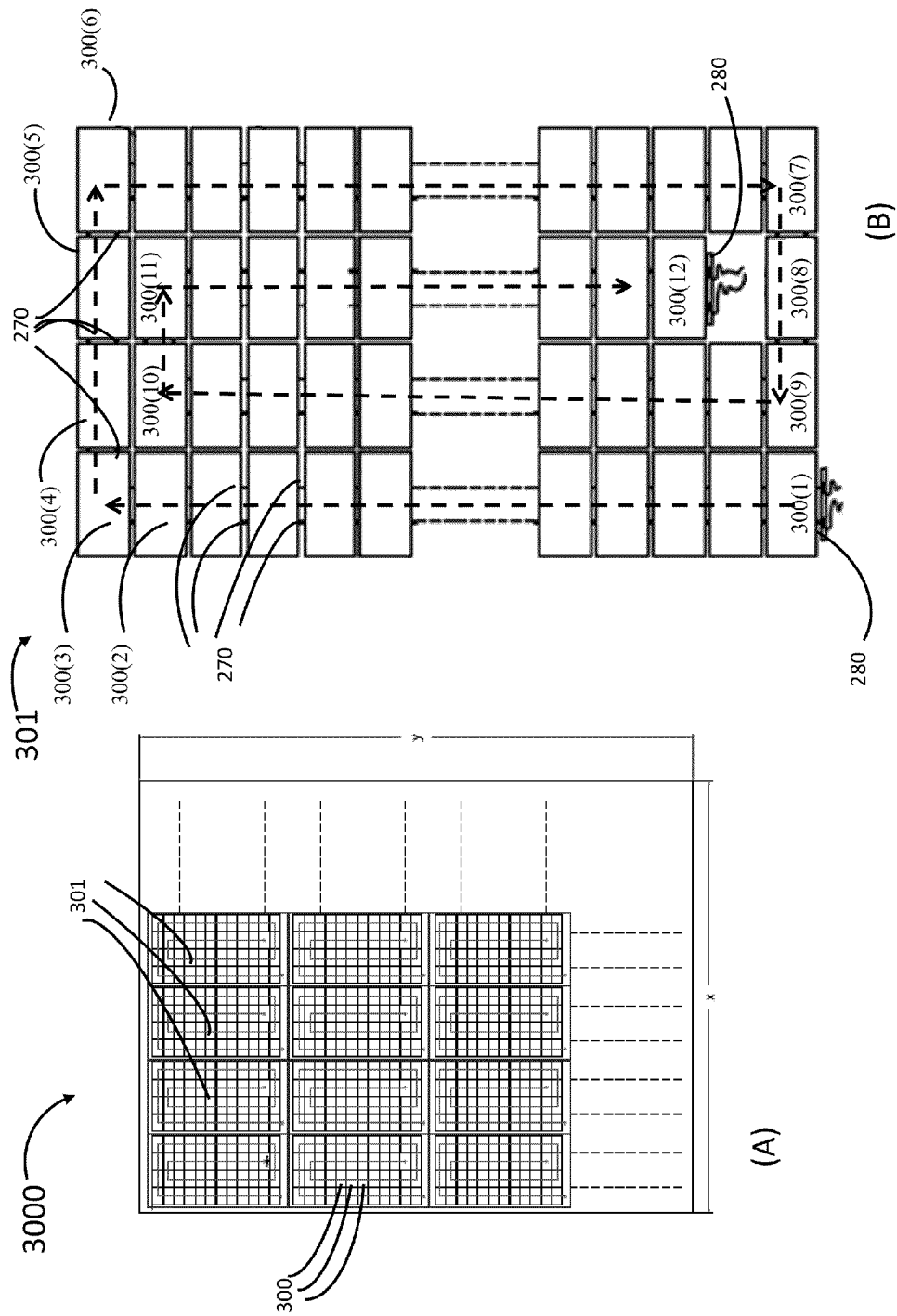
FIG. 3 illustrates examples of a solar panel, a solar cell and a string of solar cells, according to an embodiment.
Figure 3:
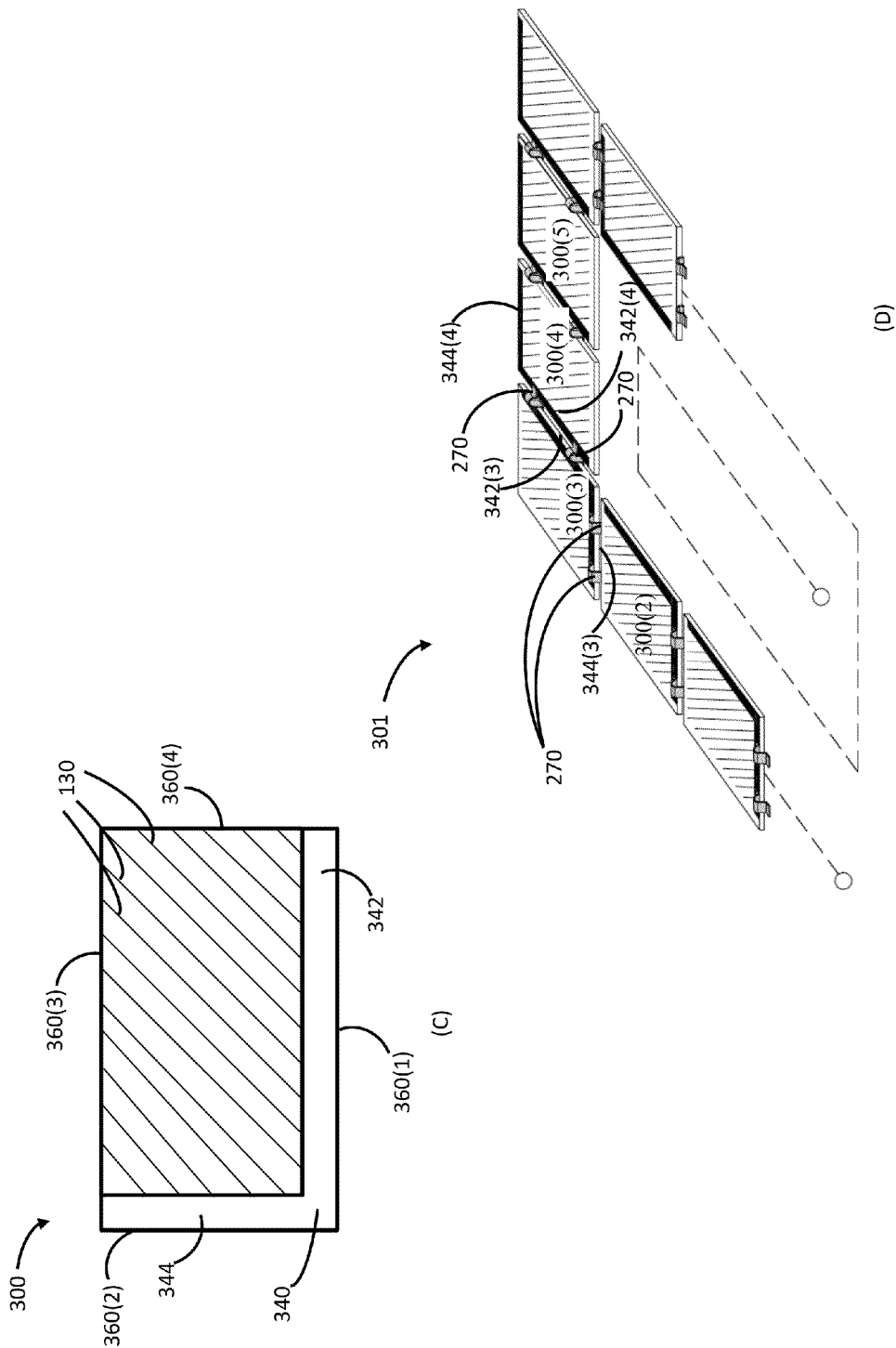

According to an embodiment of the presently disclosed techniques, referring now to FIGS. 3A and 3B, solar panel 3000 may include a number of rectilinear photovoltaic solar cells 300. Typically, although not necessarily, panel 3000 will have many hundreds or thousands of individual solar cells 300. Advantageously, a number of cell strings 301 are connected in parallel, each string consisting of a number of series-connected individual solar cells 300. For example, in the embodiment illustrated in FIG. 3A, string 301 may consist of forty eight series-connected solar cells 300. As noted hereinabove, it is preferable to arrange each individual string 301 in a serpentine or spiral arrangement. This is advantageously accomplished, in an embodiment, without recourse to external bus bars and/or wire interconnections for electrically connecting solar cells 300 within string 301. Referring now to FIG. 3B, in the illustrated embodiment, a string 301 of solar cells 300 extends from and between (positive) busbar terminal 280 at cell 300(12) and (return) busbar terminal 280 at cell 300(1). Adjacent cells in the string may be electrically connected by interconnects 270, whether or not they are vertically aligned. For example, cell 300(2) and cell 300(3), cell 300(3) and cell 300(4), cell 300(4) and cell 300(5), cell 300(5) and cell 300(6), cell 300(7) and cell 300(8), cell 300(8) and cell 300(9), and cell 300(10) and cell 300(11) may be respectively connected, electrically, by respective interconnects 270 and not by any external wiring or busbar. Thus, series connection of cells 300 of string 301 may be accomplished using only standard cell interconnects 270, and no means such as external bus bars and wire interconnections between solar cells.

The above-noted result may be achieved, in an embodiment, referring now to FIG. 3C, by configuring solar cell 300 with an "L-shaped" collector bar 340 having first collector bar segment 342 and second collector bar segment 344. First collector bar segment 342 may be substantially parallel to and proximate to first edge 360(1) of solar cell 300, and second collector bar segment 344 may be substantially parallel to and proximate to second edge 360(2). Second edge 360(2) may be orthogonal with respect to first edge 360(1). Advantageously, for ease of cell manufacture, no collector bar segment is parallel to and proximate to at least one of third edge 360(3) and fourth edge 360(4). A grid of metallic lines 130 may be conductively coupled to collector bar 340.

Referring now to FIG. 3D, it is illustrated in more detail how a solar cell 300 configured in the above-noted manner may be integrated into a string 301 a substantially spiral layout. Advantageously, electrical connections between cells within a string are made by respective interconnects 270, and not by any external wiring or busbar. The present inventors have appreciated that the L-shaped collector bar 340 enables adjacent rectangular solar cells 300 to be electrically connected by interconnects 270 by way of either first collector bar segment 342 or second collector bar segment 344.

Advantageously, solar cells 300 may be of an identical configuration and be selectively oriented to facilitate a desired layout of the cell string. More specifically, for example, cell 300(3) and cell 300(4) may be identical in design. To facilitate the desired layout of the cell string, however, cell 300(3) may be disposed with first collector bar segment 342(3) adjacent to cell 300(4) (on the right, in the illustrated view) and second collector bar segment 344(3) adjacent to cell 300(2) (at the bottom), whereas cell 300(4) is oriented with a 180 degree rotation with respect to cell 300(3). As a result of the 180 degree rotation, first collector bar segment 342(4) is on the left (adjacent to cell 300(3)), and second collector bar segment 344(4) is at the top.

Figure 4:
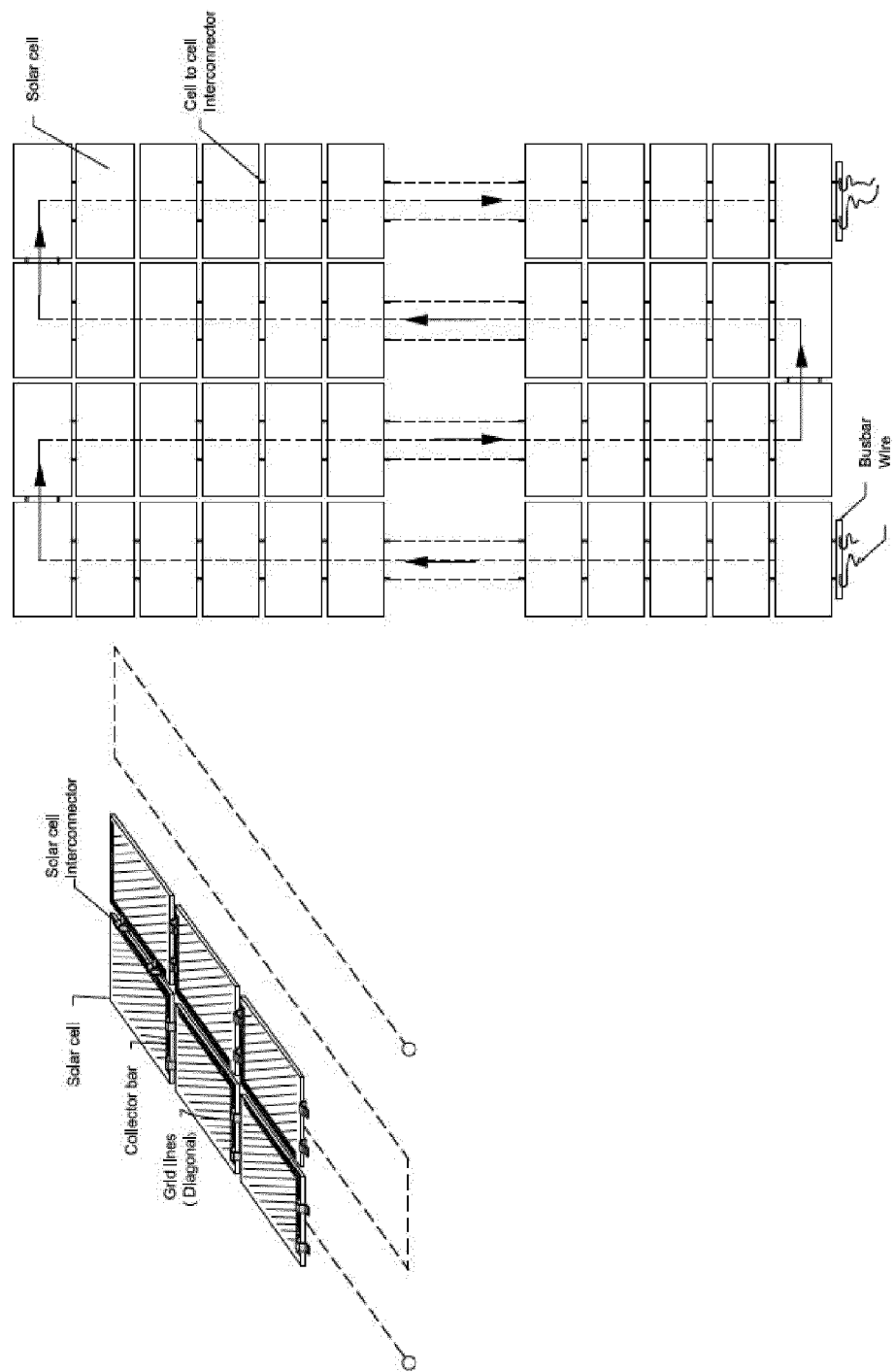
FIG. 4 illustrates an example of a string of solar cells, according to an embodiment

In the embodiment illustrated in FIG. 3D, string 301 is configured in a substantially spiral fashion. A serpentine arrangement such as, for example, an 'S' shaped pattern, is likewise within the contemplation of the present inventors. An example of an 'S' shaped serpentine pattern is illustrated in FIG. 4.

Advantageously, all electrical connections between cells of string 301 may be made by interconnects 270, and not by any other means, such as electrical wiring 290 of the prior art. As a result, an appreciable amount of solar panel area that would otherwise be reserved for such wiring may be made available for placement of solar cells. Moreover, elimination of the need for such wiring contributes to an improvement in solar panel reliability and a decrease in panel cost.

Referring now to FIG. 5A, in some embodiments, a square or rectangular solar cell may be configured such that the grid of metallic lines 130 are disposed substantially orthogonal to first edge 360(1), and substantially parallel to second edge 360(2). Advantageously, referring now to FIG. 5B, each of the plurality of parallel metallic lines 130 may be disposed at an acute angle to first edge 360(1) and to second edge 360(2).

In some embodiments, illustrated in FIG. 5C, a square or rectangular solar cell may be configured such that a third collector bar segment 346 is substantially parallel to third edge 360(3).

In some embodiments, illustrated in FIG. 5D, a square or rectangular solar cell may be configured such that a fourth collector bar segment 348 is substantially parallel to fourth edge 360(4).

Thus, techniques have been disclosed, wherein an improved configuration of a solar cell current collector bar and contact grid pattern, yields increased solar panel efficiencies by improving the panel packing ratio. Moreover, the techniques substantially eliminate a need for external bus bars and/or wire interconnections between solar cells, and simplifies solar panel integration, which in turn contributes to an improvement in panel reliability and a decrease in panel cost.

The foregoing merely illustrates principles of the invention. It will thus be appreciated that those skilled in the art will be able to devise numerous systems and methods which, although not explicitly shown or described herein, embody said principles of the invention and are thus within the spirit and scope of the invention as defined by the following claims.

What is claimed is:

1. An apparatus comprising:
    a plurality of solar cells substantially identical in design, comprising at least a first solar cell and a second solar cell adjacent to the first solar cell;
    each of the plurality of solar cells including:
        a semiconductor substrate comprising a light receiving surface, a first edge, a second edge, a third edge, and a fourth edge;
        a back surface, opposite to the light receiving surface and comprising a first back surface electrode;
        a current collector bar disposed proximate to the light receiving surface; and
        a grid of metallic lines conductively coupled to the current collector bar, each of the current collector bar and the grid of metallic lines being disposed on the light receiving surface, the current collector bar comprising at least two conductively coupled collector bar segments, wherein:
            a first collector bar segment of the least two conductively coupled collector bar segments is substantially parallel to and proximate to the first edge, and a second collector bar segment of the least two conductively coupled collector bar segments is substantially parallel to and proximate to the second edge, the second edge being orthogonal with respect to the first edge;
            no collector bar segment is parallel to and proximate to at least one of the third edge and the fourth edge;
            the plurality of solar cells is configured to be disposed in a string on a surface of a solar panel, the string including a plurality of cell interconnects and being disposed in a substantially serpentine or spiral pattern that includes at least one 90 degree angle, the first solar cell and the second solar cell being disposed in a coplanar manner so as to be separated by a first intercell gap and electrically coupled only by one or more of the plurality of cell interconnects that cross the first intercell gap and conductively couple a second back surface electrode of the second solar cell with the current collector bar of the first solar cell;
            each of the plurality of cell interconnects has a footprint area that is entirely contained within a respective solar cell footprint area, the respective solar cell footprint area consisting of only a footprint area of two adjacent cells and a respective intercell gap separating the two adjacent cells; and
            no solar cell within the string is electrically connected to another solar cell in the string by any means other than at least one of said plurality of cell interconnects.

2. The apparatus of claim 1, wherein the grid of metallic lines comprises a plurality of parallel metallic lines, said plurality of parallel metallic lines being substantially straight.

3. The apparatus of claim 2, wherein each of the plurality of parallel metallic lines is disposed substantially orthogonal to the first edge, and substantially parallel to the second edge.

4. The apparatus of claim 1, wherein the first solar cell is substantially rectangular.

5. The apparatus of claim 4, wherein the first edge length is at least 1.1 times as long as the second edge length.

6. The apparatus of claim 4, wherein the substantially rectangular solar cell has at least one corner section disposed between two edges, the corner section being substantially shorter than a length of any edge.

* * * * *